United States Patent [19]
Lee et al.

[11] Patent Number: 5,252,510
[45] Date of Patent: Oct. 12, 1993

[54] METHOD FOR MANUFACTURING A CMOS DEVICE HAVING TWIN WELLS AND AN ALIGNMENT KEY REGION

[75] Inventors: Dai H. Lee, Seoul; Hyung L. Ji, Kyoungki, both of Rep. of Korea

[73] Assignee: Hyundai Electronics Industries Co., Ltd., Kyoung Ki, Rep. of Korea

[21] Appl. No.: 874,920

[22] Filed: Apr. 29, 1992

[30] Foreign Application Priority Data

May 3, 1991 [KR] Rep. of Korea .................. 91-7187

[51] Int. Cl.$^5$ ............................................ H01L 21/76
[52] U.S. Cl. ...................................... 437/57; 437/70; 437/924; 148/DIG. 70
[58] Field of Search ................... 437/34, 56, 57, 70, 437/147, 924; 148/DIG. 70, DIG. 103

[56] References Cited

U.S. PATENT DOCUMENTS

| | | | |
|---|---|---|---|
| 4,558,508 | 12/1985 | Kinney et al. | 437/34 |
| 4,561,170 | 12/1985 | Doering et al. | 437/34 |
| 4,584,027 | 4/1986 | Metz, Jr. et al. | 437/57 |
| 4,599,789 | 7/1986 | Gasner | 437/57 |
| 4,677,739 | 7/1987 | Doering et al. | 148/DIG. 82 |
| 4,696,092 | 9/1987 | Doering et al. | 437/34 |
| 4,767,721 | 8/1988 | Liao et al. | 437/34 |
| 4,889,825 | 12/1989 | Parrillo | 437/57 |
| 4,925,806 | 5/1990 | Grosse | 437/57 |
| 4,929,565 | 5/1990 | Parrillo | 437/57 |
| 4,931,406 | 6/1990 | Tomioka | 437/57 |
| 4,951,114 | 8/1990 | Lewis et al. | 357/42 |
| 5,130,271 | 7/1992 | Migita | 437/70 |
| 5,132,241 | 7/1992 | Su | 437/70 |

FOREIGN PATENT DOCUMENTS 62-46552 2/1987 Japan .
3-77377 4/1991 Japan .

*Primary Examiner*—Brian E. Hearn
*Assistant Examiner*—C. Chaudhari
*Attorney, Agent, or Firm*—Lowe, Price, LeBlanc & Becker

[57] ABSTRACT

A method for manufacturing a CMOS semiconductor device having twin wells is disclosed. The method of manufacturing the CMOS device comprises the following. A silicon substrate is provided. A thick oxide layer is deposited and a first photoresist layer is coated sequentially on the silicon substrate. Then an N-well mask pattern is formed by removing a portion of the first photoresist layer, thereby defining an alignment-key region and N-well region and forming a thin oxide layer on such regions. An N-type impurity implantion process is then performed through exposed portions of the thin oxide layer into the silicon substrate, and the first photoresist layer portions remaining on the thick oxide layer are removed, to thereby expose the entire surface of the thick oxide layer. A second photoresist layer is coated on the entire surface of the oxide layer. Then a P-well mask pattern is formed by removing portions of the second photoresist layer, thereby defining a P-well region and forming a thin oxide layer thereon. A P-type impurity diffusion process is performed through expose portions of the thin oxide layer into the silicon substrate, and the remaining portions of the second photoresist layer are removed. Then an N-well region and P-well region are formed in the substrate by diffusing the N-type impurity and P-type impurity into the substrate via a drive-in process, and an oxide layer grown on and beneath the thin oxide layer and thick oxide layer are removed.

5 Claims, 3 Drawing Sheets

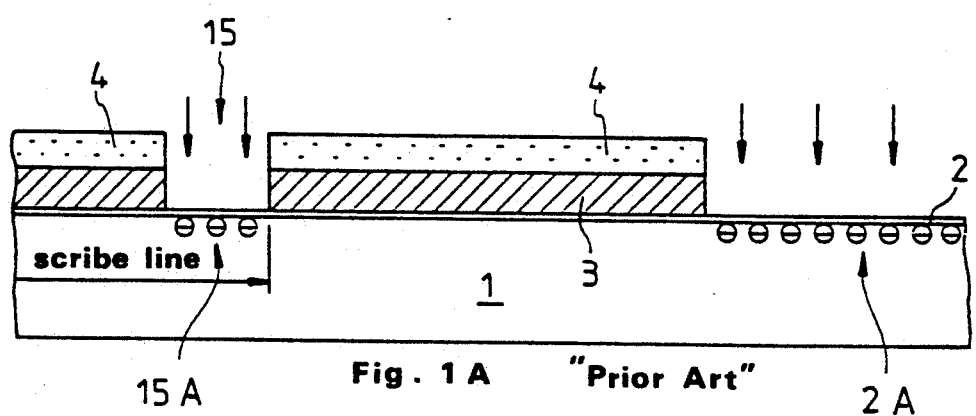
Fig. 1A "Prior Art"
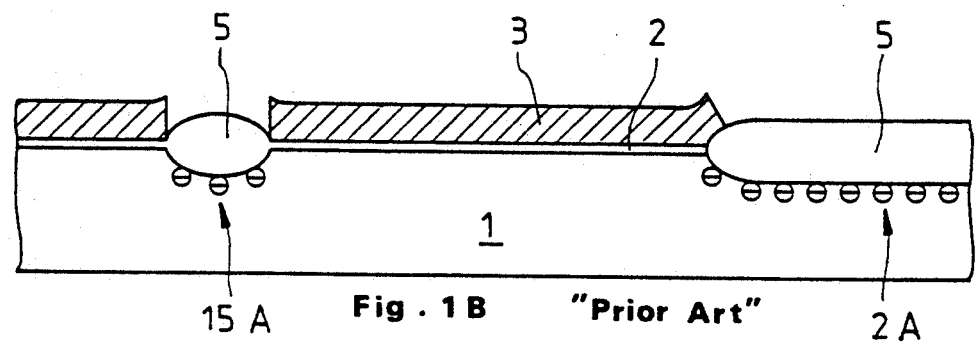
Fig. 1B "Prior Art"
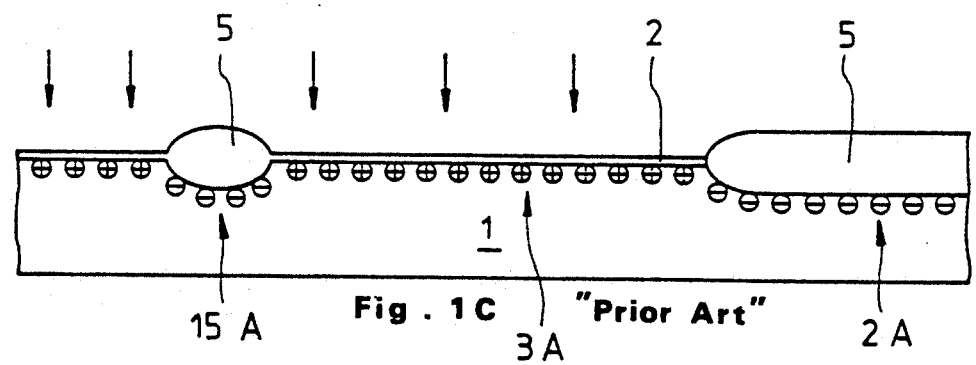
Fig. 1C "Prior Art"
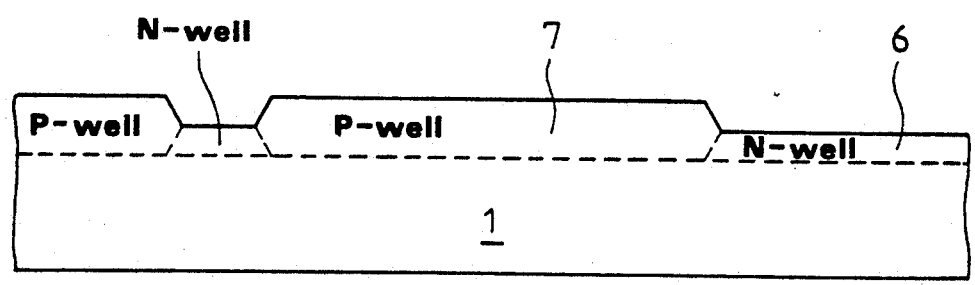
Fig. 1D "Prior Art"

METHOD FOR MANUFACTURING A CMOS DEVICE HAVING TWIN WELLS AND AN ALIGNMENT KEY REGION

FIELD OF THE INVENTION

The invention relates to a method for manufacturing a CMOS device, and more particularly to a method for manufacturing a CMOS device having twin wells, which can eliminate the step occurring on a silicon substrate.

BACKGROUND OF THE INVENTION

Generally, CMOS devices have a P-type well and an N-type well formed in a substrate. Such semiconductor devices having two wells of different types are known as twin-well-type semiconductor devices.

In the prior art, with respect to twin-well-type semiconductor devices when the field oxide layer which was grown on an N-well region is removed after the P-well region on a silicon substrate is formed, problematically a step occurs on the surface of the silicon substrate, so that a characteristic of semiconductor devices might be deteriorated.

Therefore, it is an objective of the present invention to solve the problem set forth above and to provide a method for manufacturing a CMOS device having twin wells, which method can eliminate the step occurring on a silicon substrate.

The above-said objective should be construed as only one of many possible through the utilization of a few of the more practical and important features and applications of the invention. Many other beneficial results can be obtained by applying the disclosed invention in a different manner or modifying the invention within the scope of the disclosure. Accordingly, other objectives and a fuller understanding of the invention may be had by referring to both the summary of the invention and the detailed description, below, which describe the preferred embodiments and describe the scope of the invention defined by the claims, whose summary and description should be considered in conjunction with the accompanying drawings.

SUMMARY OF THE INVENTION

The method, of the present invention, for manufacturing a CMOS device having twin wells without a step occurring on the silicon substrate, is defined by the claims with at least two respective specific embodiments shown in the attached drawings.

For the purpose of summarizing the invention, a first embodiment of the invention relates to a method for manufacturing a CMOS device having twin wells, where a silicon substrate is provided. A thick oxide layer is deposited and a first photoresist layer is coated sequentially on the silicon substrate.

Then an N-well mask pattern is formed by removing a portion of the first photoresist layer to expose portions of the thick oxide layer thereunder and etching into those portions of the thick oxide layer to the extent that only the desired depth remains, thereby defining an alignment-key region and N-well region and forming a thin oxide layer. An N-type impurity is implanted through exposed portion of the thin oxide layer into the silicon substrate, by utilizing the N-well mask pattern. The first photoresist layer remaining on the thick oxide layer is removed to thereby expose the entire surface of the oxide layer. Next a second photoresist layer is coated on the entire structure.

Then a P-well mask pattern is formed by removing portions of the second photoresist layer, except for those portions of the second photoresist layer positioned above the defined alignment-key region and N-well region, to expose a portion of the thick oxide layer and then etching into said layer until same is reduced to the desired depth, thereby defining a P-well region and forming a thin oxide layer. A P-type impurity implantation process is performed through the exposed thin oxide layer so that the impurity is implanted into the portion of the silicon substrate positioned at the defined P-well region, by utilizing the P-well mask pattern, and then the remaining portions of the second photoresist layer are removed.

Then an N-well region and P-well region are formed in the substrate by diffusing the N-type impurity and P-type impurity into the substrate, via a drive-in process.

Finally, an oxide layer which has grown on and beneath the thin oxide layer and an oxide layer which has grown on a remaining thick oxide layer are removed.

A further embodiment of the present invention relates to a method for manufacturing a CMOS device having twin wells, where a silicon substrate is provided. A pad oxide layer and a nitride layer is deposited and a first photoresist layer is sequentially coated on the silicon substrate.

Then an N-well mask pattern is formed by removing a portion of the first photoresist layer to expose portions of the nitride layer thereunder and etching into the nitride layer, thereby defining an alignment-key region and N-well region. An N-type impurity is implanted, through exposed portion of the pad oxide layer into the silicon substrate, by utilizing the N-well mask pattern.

The portions of the first photoresist layer remaining on the nitride layer are removed. Next, a second photoresist layer is coated on the remaining portions of the nitride layer and the partially-exposed pad oxide layer.

Then a P-well mask pattern is formed by removing portion of the second photoresist layer, except for those portions of the second photoresist layer positioned above the defined alignment-key region and N-well region, to expose portions of the nitride layer thereunder and etching into those portions of the nitride layer, thereby defining a P-well region. A P-type impurity implantation process is performed through the exposed parts of the pad oxide layer so that the impurity is implanted into the portions of the silicon substrate positioned at the defined P-well region, by utilizing the P-well mask pattern. The remaining portions of the second photoresist layer are removed.

Then an N-well region and P-well region are formed in the substrate by diffusing the N-type impurity and P-type impurity into the substrate through the pad oxide layer, via a drive-in process. Finally, the remaining portions of the nitride layer and a field oxide layer which has grown on and beneath the pad oxide layer are removed.

The more practical and important features of the present invention have been outlined above in order that the detailed description of the invention which follows will be better understood and that the present contribution to the art can be fully appreciated. Additional features of the invention described hereinafter also form the subject matter of the claims of the invention. Those skilled in the art can appreciate that the conceptions and the specific embodiments disclosed herein may be readily utilized as bases for modifying or designing other structures for carrying out the same purposes as those of the present invention. Further, those skilled in the art can realize that such modified or newly-designed other structures do not depart from the spirit and scope of the invention as set forth in the claims.

BRIEF DESCRIPTION OF THE DRAWINGS

For a fuller understanding of the nature and objectives of the invention, reference should be made to the following Detailed Description of the Invention in conjunction with the accompanying drawings, a brief description of which drawings follow:

FIG. 1A through FIG. 1D describe process steps for manufacturing a CMOS device having twin wells, according to the prior art.

Figure 2A:
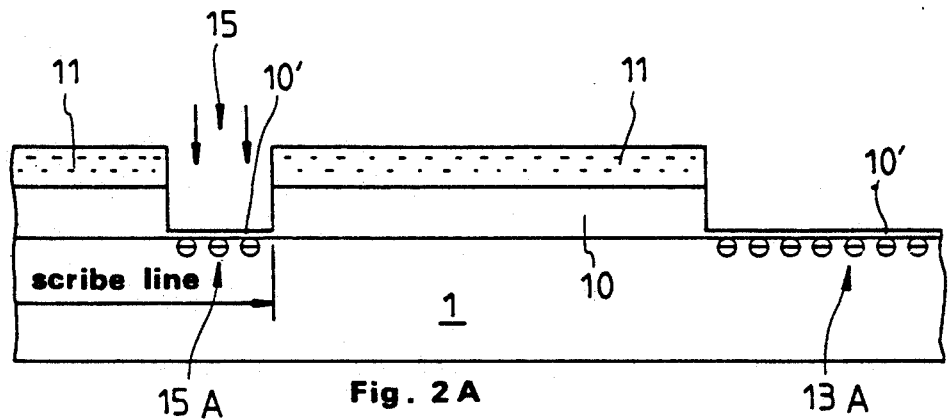
FIG. 2A through FIG. 2D describe process steps for manufacturing a CMOS device having twin wells without a step occurring on a silicon substrate, in accordance with the first embodiment of the present invention.

The respective reference numerals noted in the Detailed Description below refer to the respective reference numerals relating to the pertinent drawing parts and found as applicable throughout the several views of the drawings.

DETAILED DESCRIPTION OF THE INVENTION

FIG. 1A through FIG. 1D represent process steps for manufacturing a CMOS device having twin wells, according to the prior art.

Referring to FIG. 1A, a pad oxide layer 2 is grown on a silicon substrate 1, and a nitride layer 3 is deposited and a photoresist layer 4 is coated thereon sequentially. Thereafter, an N-well mask pattern is formed by removing portions of the photoresist layer 4 and nitride layer 3 to expose portions of the pad oxide layer 2, thereby defining an alignment-key region 15A and an N-well region 2A. Next, an N-type impurity is implanted through the pad oxide layer 2 into portions of the silicon substrate 1 positioned at the defined alignment-key region 15A and N-well region 2A, by utilizing the N-well mask pattern.

It should be noted that the align-key 15 is formed above a scribe line.

FIG. 1B illustrates a cross-sectional view of a CMOS device having twin wells, in respect of which portions of the photoresist layer 4 illustrated in FIG. 1A are removed and a field oxide layer 5 is grown on and beneath the exposed pad oxide layer 2 on the silicon substrate 1.

Referring to FIG. 1C, in connection with the process described in FIG. 1B, the remaining portions of the nitride layer 3 illustrated in FIG. 1C are removed and a P-type impurity is implanted through the pad oxide layer 2 into the portions of the silicon substrate 1 except for the portions of the defined alignment-key region 15A and N-well region 2A.

FIG. 1D illustrates a cross-section of a CMOS device having twin wells, where it is depicted that the implanted N-type impurity and P-type impurity illustrated in FIG. 1C are diffused into the silicon substrate 1 via a thermal drive-in process, and thereby an N-well region 6 and P-well region 7 are formed in the silicon substrate 1; thereafter, the field oxide layer 5 and pad oxide layer 2 are removed.

However, as can be seen from FIG. 1D, there is a problem in that a step has occurred on the surface of the silicon substrate 1 in which an N-well region 6 and a P-well region 7 have been formed.

FIG. 2A through FIG. 2D illustrate the process steps for manufacturing a CMOS device having twin wells, without a step occurring on a silicon substrate 1, in accordance with the first embodiment of the present invention.

Referring to FIG. 2A, a thick oxide layer 10 is formed on a silicon substrate 1; thereafter, a first photoresist layer 11 is coated on the thick oxide layer 10.

Then the portions of the first photoresist layer 11 where an alignment-key region 15A and N-well region 13A are defined and removed, by utilizing an N-well mask pattern.

Next, the portions of thick oxide 10 on the substrate 1 which is positioned at the defined alignment-key region 15A and N-well region 13A are removed to the extent that the desired oxide depth of 500 Å to 2,000 Å remains, thereby forming a thin oxide layer 10' on the silicon substrate 1, and it should be noted that the align-key 15 is formed above the scribe line illustrated in FIG. 2A. After the above process is completed, an N-type impurity is implanted through the exposed portion of the thin oxide layer 10' into the portions of the silicon substrate 1 thereunder.

Figure 2B:
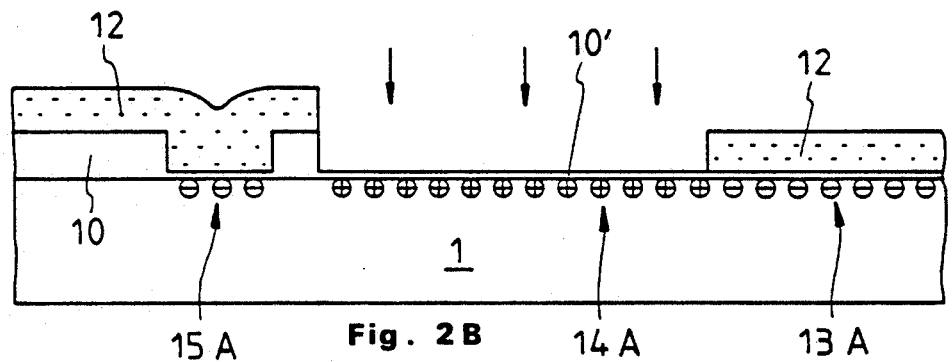

FIG. 2B illustrates a cross-section of a CMOS device, having twin wells, where it is depicted that the remaining portions of the first photoresist layer 11 illustrated in FIG. 2A on the thick oxide layer 10 are all removed and a second photoresist layer 12 is coated on the entire structure.

Next, the portion of the second photoresist layer 12, except for those portions of the second photoresist layer 12 positioned above the defined align-key region 15A and N-well region 13A, are removed by utilizing a P-well mask pattern.

Next, portion of the thick oxide layer 10 under the portion of the second photoresist layer 12 are removed to the extent that only the desired depth remains, thereby forming a thin oxide layer 10'.

Thereafter a P-type impurity is implanted through the exposed portions of the thin oxide layer 10, into the substrate 10 positioned at the defined P-well region 14A, by utilizing a P-well mask pattern.

Figure 2C:
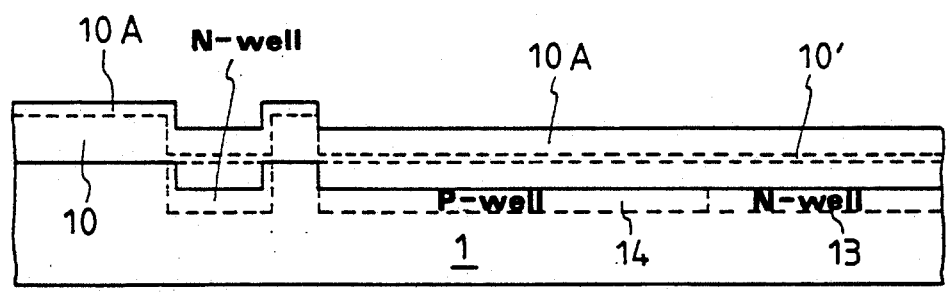

Referring to FIG. 2C, the remainder of the second photoresist layer 12 located on the portion of the thick oxide layer 10 and thin oxide layer 10' illustrated in FIG. 2B are removed.

Next, the implanted P-type impurity and N-type impurity are diffused into the silicon substrate 1 via a thermal drive-in process, and thereby a P-well region 14 and N-well region 13 are formed in the silicon substrate 1. At this point, it should be noted that an oxide layer 10A has grown on and beneath the thin oxide layer, and also an oxide layer 10A has, furthermore, grown on the thick oxide layer 10 illustrated in FIG. 2C.

Figure 2D:
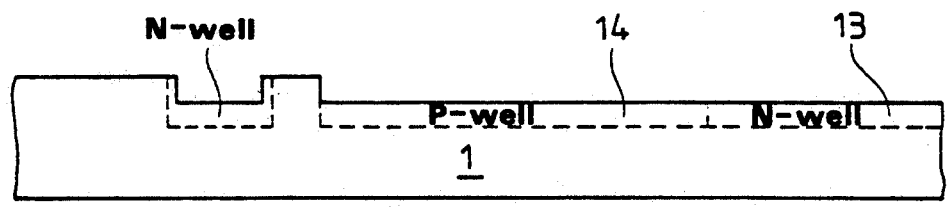

FIG. 2D illustrates a cross-section of a CMOS device, having twin wells, where it is depicted that all the oxide layers 10, 10A, 10' are removed, and thereby a P-well region 14 and an N-well region 13 are formed in the silicon substrate 1 without a step occurring.

FIG. 3A through FIG. 3D illustrate the steps for manufacturing a CMOS device, having twin wells, without a step on a silicon substrate 1 occurring, in accordance with the second embodiment of the present invention.

Figure 3A:
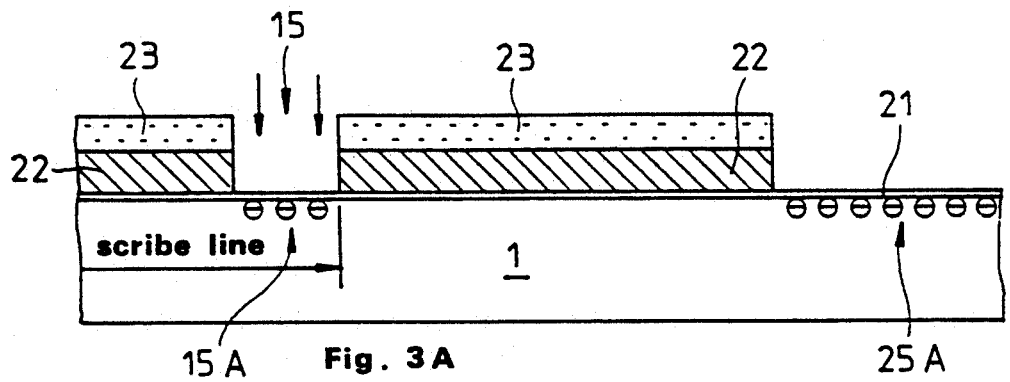
FIG. 3A through FIG. 3D describe process steps for manufacturing a CMOS device having twin wells without a step occurring on a silicon substrate, in accordance with the second embodiment of the present invention.

Referring to FIG. 3A, a pad oxide layer 21 and a nitride layer 22 are formed on the silicon substrate 1, sequentially. Thereafter, a first photoresist layer 23 is coated on the nitride layer 22. Next, the portions of the first photoresist layer 23 where an align-key region 15A and N-well region 25A are defined are removed, and the exposed portions of the nitride layer 22 thereunder are removed. After the above process is completed, an N-type impurity is implanted through the exposed portions of the pad oxide layer 21 into the portions of the silicon substrate 1 thereunder.

Figure 3B:
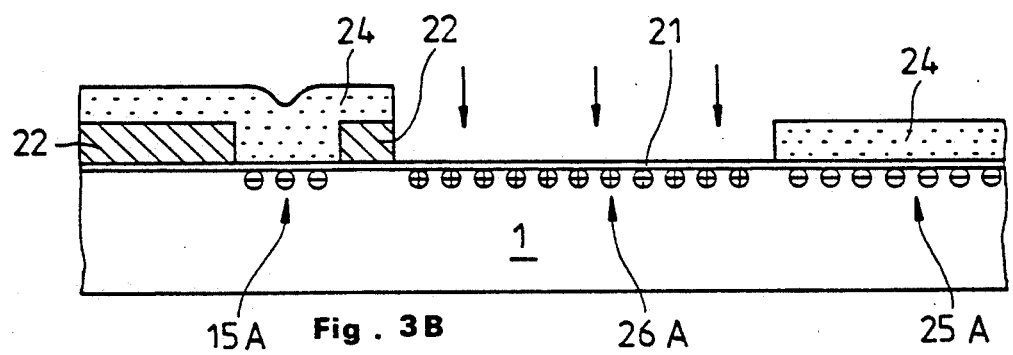

FIG. 3B illustrates a cross-section of a CMOS device, having twin wells, where it is depicted that the remaining portions of the photoresist layer 23 illustrated in FIG. 3A on the nitride layer 22 are removed, and a second photoresist layer 24 is coated on the entire structure.

Thereafter, the portion of the second photoresist layer 24, except for those portions of the second photoresist layer 24 positioned above the defined alignment-key region 15A and N-well region is removed and the exposed portion of the nitride layer 22 thereunder is removed.

Thereafter a P-type impurity is implanted through the pad oxide layer 21 into the silicon substrate 1 positioned at the defined P-well region 26A, via the utilization of a P-well mask pattern.

Figure 3C:
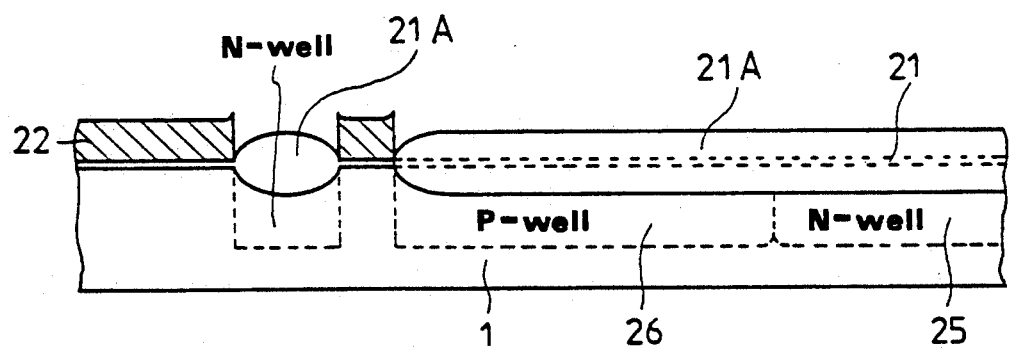

Referring to FIG. 3C, the remaining portions of the second photoresist layer 24 illustrated in FIG. 3B are all removed. Thereafter, the implanted P-type impurity and N-type impurity are diffused into the silicon substrate 1 via a thermal drive-in process, thereby forming a P-well region 26 and N-well region 25 in the silicon substrate 1. At this point, as shown in FIG. 3C, a field oxide layer 21A is grown on and beneath the exposed pad oxide layer 21 on the silicon substrate 1 thereunder.

Figure 3D:
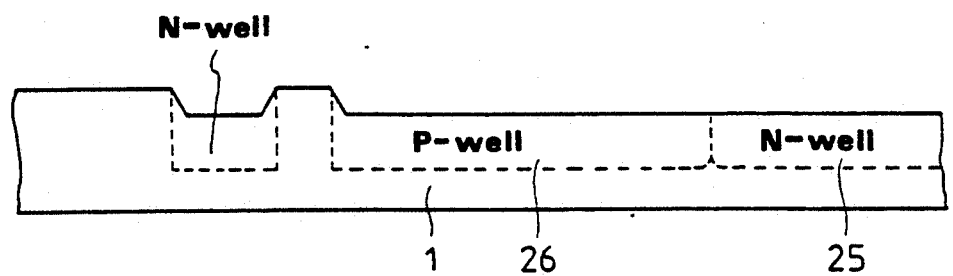

FIG. 3D illustrates a cross-section of a CMOS device, having twin wells, where it is depicted that the remaining portions of the nitride layer 22, and the pad oxide layer 21 and field oxide layer 21A, are all removed. As shown in FIG. 3D, the step on the silicon substrate 1 whereon the P-well region 26 and N-well region 25 are formed can be eliminated.

It should be noted that an N-channel field stop implant mask can be used instead of the P-well mask used as noted in the first embodiment (FIG. 2A through FIG. 2D) and the second embodiment (FIG. 3A through FIG. 3D). At the pertinent stage, a P-type impurity is implanted into the silicon substrate without a separated P-well mask, and thereby a twin well without a step on the silicon substrate can be formed.

As described above, by use of the present invention the step occurring on the silicon substrate, when a CMOS device having twin wells is manufactured by use of a LOCOS process under the prior art, can be eliminated, and a separate mask process is not necessary for forming an alignment-key because the alignment-key can be formed simultaneously with the formation of an N-well region, by use of an N-well mask pattern.

Although this invention has been described in its preferred forms with a certain degree of particularity, it will be appreciated by those skilled in the art that the present disclosure of the preferred forms has been effected only by way of example, and that numerous changes in the details of the construction, combination and arrangement of parts may be resorted to without departing from the spirit and scope of the invention.

What is claimed is:

1. A method for manufacturing a CMOS device, having twin wells, which method comprises:
   providing a silicon substrate;
   sequentially depositing a thick oxide layer and coating a first photoresist layer on the silicon substrate;
   forming an N-well mask pattern by removing a portion of the first photoresist layer to expose portions of the thick oxide layer thereunder and etching into those portions of the thick oxide layer until same is reduced to the desired depth, thereby defining an alignment-key region and N-well region which are formed simultaneously via a one-step process and forming a thin oxide layer on such regions;
   performing an N-type impurity implantation process through the exposed portions of the thin oxide layer into the portions of the silicon substrate positioned at the defined alignment-key region and N-well region, by utilizing the N-well mask pattern;
   removing the first photoresist layer portions remaining on the thick oxide layer, to thereby expose the entire surface of the thick oxide layer;
   coating a second photoresist layer on the entire structure;
   forming a P-well mask pattern by removing portions of the second photoresist layer, except for those portions of the second photoresist layer positioned above the defined alignment-key region and N-well region, to expose a portion of the thick oxide layer and then etching into said layer until same is reduced to the desired depth, thereby defining a P-well region and forming a thin oxide layer on such region;
   performing a P-type impurity implantation process through the exposed portions of the thin oxide layer into the portions of the silicon substrate positioned at the defined P-well region, by utilizing the P-well mask pattern;
   removing the remaining portions of the second photoresist layer;
   forming an N-well region and P-well region in the substrate by further diffusing the N-type impurity and P-type impurity into the substrate via a drive-in process; and
   removing two oxide layers respectively grown on and beneath the thin oxide layer and grown on the remaining thick oxide layer.

2. The method of claim 1, wherein an N-Channel field stop implant mask is used instead of the P-well mask pattern.

3. The method of claim 1, wherein said alignment-key has a thickness of 500 Å to 2,000 Å.

4. A method for manufacturing a CMOS device, having twin wells, which method comprises:
   providing a silicon substrate;
   sequentially depositing a pad oxide layer and a nitride layer and coating a first photoresist layer on the silicon substrate;
   forming an N-well mask pattern by removing a portion of the first photoresist layer to expose portions of the nitride layer thereunder and etching into the nitride layer, thereby defining an alignment-key region and N-well region which are formed simultaneously via a one-step process;

performing an N-type impurity implantation process through the exposed portions of the pad oxide layer into portions of the silicon substrate positioned at the defined alignment-key region and N-well region, by utilizing the N-well mask pattern;

removing the first photoresist layer portions remaining on the nitride layer;

coating a second photoresist layer on the remaining portions of the nitride layer and the exposed portions of the pad oxide layer;

forming a P-well mask pattern by removing portion of the second photoresist layer, except for those portions of the second photoresist layer positioned above the defined alignment-key region and N-well region, to expose the nitride layer and etching into the nitride layer, thereby defining a P-well region;

performing a P-type impurity implantation process through the exposed portions of the pad oxide layer into the portions of the silicon substrate positioned at the defined P-well region, by utilizing the P-well mask pattern;

removing the remaining portions of the second photoresist layer;

forming an N-well region and P-well region in the substrate by further diffusing the N-type impurity and P-type impurity into the substrate, via a drive-in process; and removing a field oxide layer which field oxide layer was grown on and beneath the exposed pad oxide layer and the remaining portions of the nitride layer.

5. The method of claim 4, wherein an N-Channel field stop implant mask is used instead of the P-well mask pattern.

* * * * *